United States Patent
Lazar et al.

(10) Patent No.: US 8,023,046 B2
(45) Date of Patent: Sep. 20, 2011

(54) MULTI-INPUT MULTI-OUTPUT TIME ENCODING AND DECODING MACHINES

(75) Inventors: Aurel A. Lazar, New York, NY (US); Eftychios A. Pnevmatikakis, New York, NY (US)

(73) Assignee: The Trustees of Columbia University in the city of New York, New York, NY (US)

( * ) Notice: Subject to any disclaimer, the term of this patent is extended or adjusted under 35 U.S.C. 154(b) by 0 days.

(21) Appl. No.: 12/645,292

(22) Filed: Dec. 22, 2009

(65) Prior Publication Data

US 2010/0225824 A1 Sep. 9, 2010

Related U.S. Application Data (63) Continuation of application No. PCT/US2008/068790, filed on Jun. 30, 2008, which is a continuation of application No. 11/965,337, filed on Dec. 27, 2007.

(60) Provisional application No. 60/946,918, filed on Jun. 28, 2007, provisional application No. 61/037,224, filed on Mar. 17, 2008.

(51) Int. Cl.
*H04L 27/00* (2006.01)
(52) U.S. Cl. ........................ 348/723; 375/340
(58) Field of Classification Search .......... 341/110–172; 348/723, 725, E5.093, E5.096; 375/295, 375/340
See application file for complete search history.

(56) References Cited

U.S. PATENT DOCUMENTS

| | | | | |
|---|---|---|---|---|
| 5,392,044 A * | 2/1995 | Kotzin et al. | ................. | 341/155 |
| 5,393,237 A * | 2/1995 | Roy et al. | ...................... | 439/134 |
| 5,424,735 A * | 6/1995 | Arkas et al. | ................... | 341/157 |
| 5,511,003 A | 4/1996 | Agarwal | | |
| 5,568,142 A * | 10/1996 | Velazquez et al. | ........... | 341/126 |
| 6,121,910 A * | 9/2000 | Khoury et al. | ................ | 341/143 |
| 6,177,910 B1 * | 1/2001 | Sathoff et al. | ................. | 343/766 |
| 6,332,043 B1 * | 12/2001 | Ogata | ........................... | 382/240 |
| 6,441,764 B1 * | 8/2002 | Barron et al. | ................. | 341/155 |
| 6,476,749 B1 * | 11/2002 | Yeap et al. | .................... | 341/155 |
| 6,476,754 B2 * | 11/2002 | Lowenborg et al. | ......... | 341/155 |
| 6,511,424 B1 * | 1/2003 | Moore-Ede et al. | ......... | 600/300 |
| 7,028,271 B2 * | 4/2006 | Matsugu et al. | .............. | 716/107 |
| 7,336,210 B2 * | 2/2008 | Lazar | ........................... | 341/110 |
| 2005/0190865 A1 | 9/2005 | Lazar et al. | | |
| 2006/0261986 A1 | 11/2006 | Lazar | | |

OTHER PUBLICATIONS

Lazar, A.A., "Time Encoding Machines with Multiplicative Coupling, Feedforward, and Feedback", Circuits and Systems II: Express Briefs, IEEE Transactions on vol. 53, Issue 8, Aug. 2006, pp. 672-676.
Lazar, A.A., "Time Encoding and Perfect Recovery of Bandlimited Signals", Acoustics, Speech, and Signal Processing, 2003, Proceedings (ICASSP 2003), 2003 IEEE International Conference on vol. 6, pp. VI-709-712 vol. 6.
Lazar, Aurel A., "Time Encoding Using Filter Banks and Integrate and-Fire Neurons", Department of Electrical Engineering, Columbia University, Sep. 2003.

* cited by examiner

*Primary Examiner* — Lam T Mai
(74) *Attorney, Agent, or Firm* — Baker Botts L.L.P.

(57) ABSTRACT

Methods and systems for encoding and decoding signals using a Multi-input Multi-output Time Encoding Machine (TEM) and Time Decoding Machine are disclosed herein.

25 Claims, 9 Drawing Sheets

MULTI-INPUT MULTI-OUTPUT TIME ENCODING AND DECODING MACHINES

CROSS REFERENCE TO RELATED APPLICATIONS

This application is a continuation of International Patent Application Serial No. PCT/US08/068,790 filed Jun. 30, 2008, which is a CON of and claims priority to U.S. patent application Ser. No. 11/965,337, filed Dec. 27, 2007; which claims priority to U.S. Provisional Application Ser. No. 60/946,918, filed Jun. 28, 2007, and which claims priority to U.S. Provisional Application Ser. No. 61/037,224, filed Mar. 17, 2008. This application hereby incorporates by reference the disclosures of each of the above-listed applications in their entireties.

STATEMENT REGARDING FEDERALLY SPONSORED RESEARCH

This invention was made with government support under grants CCF-06-35252, awarded by the National Science Foundation, and R01 DC008701-01, awarded by the National Institutes of Health. The government has certain rights in the invention.

BACKGROUND

1. Field

The present application relates to methods and systems for a Multi-input Multi-output (MIMO) Time Encoding Machines (TEMs) and Time Decoding Machines (TDMs) as well as uses of TEMs and TDMs for encoding and decoding video signals.

2. Background Art

Most signals in the natural world are analog, i.e., cover a continuous range of amplitude values. However, most computer systems for processing these signals are binary digital systems. Generally, synchronous analog-to-digital (A/D) converters are used to capture analog signals and present a digital approximation of the input signal to a computer processor. That is, at precise moments in time synchronized to a system clock, the amplitude of the signal of interest is captured as a digital value. When sampling the amplitude of an analog signal, each bit in the digital representation of the signal represents an increment of voltage, which defines the resolution of the A/D converter. Analog-to-digital conversion is used in numerous applications, such as communications where a signal to be communicated can be converted from an analog signal, such as voice, to a digital signal prior to transport along a transmission line.

Applying traditional sampling theory, a band limited signal can be represented with a quantifiable error by sampling the analog signal at a sampling rate at or above what is commonly referred to as the Nyquist sampling rate. It is a continuing trend in electronic circuit design to reduce the available operating voltage provided to integrated circuit devices. In this regard, power supply voltages for circuits are constantly decreasing. While digital signals can be processed at the lower supply voltages, traditional synchronous sampling of the amplitude of a signal becomes more difficult as the available power supply voltage is reduced and each bit in the A/D or D/A converter reflects a substantially lower voltage increment.

Time Encoding Machines (TEMs) can encode analog information in the time domain using only asynchronous circuits. Representation in the time domain can be an alternative to the classical sampling representation in the amplitude domain. Applications for TEMs can be found in low power nano-sensors for analog-to-discrete (A/D) conversion as well as in modeling olfactory systems, vision and hearing in neuroscience.

SUMMARY

Systems and methods for using MIMO TEMs and TDMs are disclosed herein.

According to some embodiments of the disclosed subject matter, methods for encoding a plurality (M) of components of a signal include filtering each of the M components into a plurality (N) filtered signals and encoding each of the N filtered-signals using at least one Time Encoding Machine (TEM) to generate a plurality (N) of TEM-encoded filtered signals. In some embodiments include the TEM can be an integrate-and-fire neuron, can have multiplicative coupling, and/or can be an asynchronous sigma/delta modulator. In some embodiments, a bias value can be added to each of the N filtered-signals. In some embodiments, the M signals can be irregularly sampled.

In further embodiments, each of the N filtered signals can be represented by the equation $v^j=(h^j)^T*u$, where $h^j=[h^{j1}, h^{j2}, \ldots h^{jM}]^T$ is a filtering vector corresponding to one of the N filtered signals represented by j. In some embodiments, the N TEM-encoded filtered signals can represented by $q_k^j$, where $q_k^j = \kappa^j \delta^j - b^j(t_{k+1}^j - t_k^j)$, for all times represented by a value $k \in \mathbb{Z}$, and each of the N filtered signals represented by a value j, $j=1, 2, \ldots N$, where $k^j$ is an integration constant, $\delta^j$ is a threshold value, and $b^j$ is a bias value for each of the N filtered signals.

According to some embodiments of the disclosed subject matter, methods for decoding a TEM-encoded signal include, receiving a plurality (N) of TEM-encoded filtered signals, decoding the N TEM-encoded filtered signals using at least one Time Decoding Machine (TDM) to generate a plurality (N) of TDM-decoded signal components, and filtering each of the N TDM-decoded signal components into a plurality (M) of output signals components. In some embodiments, one of the M output signal components, represented by the i-th component of the vector valued signal u, $|u^i(t)| \leq c^i$, can be recovered by solving for $$u^i(t) = \sum_{j=1}^{N} \sum_{k \in \mathcal{J}} c_k^j \psi_k^{ji}(t),$$

where $\psi_k^{ji}(t) = (\tilde{h}^{ji}*g)(t-s_k^j)$, for all i, $i=1, 2, \ldots M$, $s_k^j = (t_{k+1}^j + t_k^j)/2$, $\tilde{h}^{ji}$ is the involution of $h^{ji}$, $h^{ji}$ is represented in a TEM-filterbank $$h(t) = \begin{bmatrix} h^{11}(t) & h^{12}(t) & \ldots & h^{1M}(t) \\ h^{21}(t) & h^{22}(t) & \ldots & h^{2M}(t) \\ \vdots & \vdots & \ddots & \vdots \\ h^{N1}(t) & h^{N2}(t) & \ldots & h^{NM}(t) \end{bmatrix},$$

and $[c^j]_k = c_k^j$ $j=1, 2, \ldots N$, where $c=[c^1, c^2, \ldots, c^N]^T$, $c=G^+q$, where $q=[q^1, q^2, \ldots, q^N]^T$ and $[q^j]_k = q_k^j$ and $$[G^{ij}]_{kl} = \sum_{m=1}^{M} \int_{j_k}^{j_{k+1}} h^{jm} * \tilde{h}^{jm} * g(t - s_l^j) ds.$$

In some embodiments, the M TEM-encoded signals can be irregularly sampled.

According to some embodiments of the disclosed subject matter, methods for encoding a video stream signal include filtering the video stream signal into a plurality (N) of spatiotemporal field signals, and encoding each of the N spatiotemporal field signals with a Time Encoding Machine to generate a plurality (N) of TEM-encoded spatiotemporal field signals. In some embodiments, the spatiotemporal field signals can be described by an equation $$v^j(t) = \int_{-\infty}^{+\infty} \left( \int \int_X D^j(x, y, s,) I(x, y, t-s) dx dy \right) ds,$$

where $D^j(x,y,s)$ is a filter function, and $I(x,y,t)$ represents the input video stream.

In some embodiments, the N TEM-encoded spatiotemporal field signals can be represented by a sampling function: $\psi_k^j(x,y,t) = D(x,y,-t) * g(t-s_k^j)$, for k spike times, for each (x,y) in a bounded spatial set, where j corresponds to each of the N TEM-encoded spatiotemporal field signals, and where $g(t) = \sin(\Omega t)/\pi t$.

According to some embodiments of the disclosed subject matter, methods for decoding a TEM-encoded video stream signal include receiving a plurality (N) of TEM-encoded spatiotemporal field signals, decoding each of the N TEM-encoded spatiotemporal field signals using a Time Decoding Machine (TDM) to generate a TDM-decoded spatiotemporal field signal, and combining each of the TDM-decoded spatiotemporal field signals to recover the video stream signal.

In some embodiments, the decoding and combining can be achieved by applying an equation:

$$I(x, y, t) = \sum_{j=1}^{N} \sum_{k \in \mathcal{J}} c_k^j \psi_k^j(x, y, t),$$

where $\psi_k^j(x,y,t) = D(x,y,t) * g(t-s_k^j)$, for k spike times, for each (x,y) in a bounded spatial set, where j corresponds to each of the N TEM-encoded spatiotemporal field signals, and where $g(t) = \sin(\Omega t)/\pi t$, and where $[c^j]_k = c_k^j$ and $c=[c^1, c^2, \ldots c^1]^T$, $c=G^+q$, where T denotes a transpose, $q=[q^1, q^2, \ldots q^N]^T$, $[q^j]_k = q_k^j$ and $G^+$ denotes a pseudoinverse, a matrix G is represented by $$G = \begin{bmatrix} G^{11} & G^{12} & \ldots & G^{1N} \\ G^{21} & G^{22} & \ldots & G^{2N} \\ \vdots & \vdots & \ddots & \vdots \\ G^{N1} & G^{N2} & \ldots & G^{NN} \end{bmatrix}$$

$[G^{ij}]_{k1} = \langle D^i(x,y,\cdot)*g(\cdot - t_k^i), D^j(x,y,\cdot)*g(\cdot - t_l^j) \rangle$.

According to some embodiments of the disclosed subject matter, methods of altering a video stream signal include receiving a plurality (N) of TEM-encoded spatiotemporal field signals from a plurality (N) of TEM-filters applying a switching matrix to map the N TEM-encoded spatiotemporal field signals to a plurality (N) of reconstruction filters in a video stream signal TDM. In some embodiments for rotating the video stream signal the switching matrix can map each of the N TEM-encoded spatiotemporal field signals from a TEM-filter ([x,y], $\alpha$, $\theta$) to a reconstruction filter ([x,y], $\alpha$, $\theta + l\theta_0$), where $l\theta_0$ represents a desired value of rotation.

In some embodiments for zooming the video stream signal the switching matrix can map each of the N TEM-encoded spatiotemporal field signals from a TEM-filter ([x,y], $\alpha$, $\theta$) to a reconstruction filter ([x,y], $\alpha_0^m \alpha$, $\theta$), where $\alpha_0^m$ represents a desired value of zoom.

In some embodiments for translating the video stream signal by a value $[nb_0, kb_0]$ the switching matrix can map each of the N TEM-encoded spatiotemporal field signals from a TEM-filter ([x,y], $\alpha$, $\theta$) to a reconstruction filter at ([x+nb_0, y+kb_0], $\alpha$, $\theta$).

In some embodiments for zooming the video stream signal by a value $\alpha_0^m$ and translating the video stream signal by a value $[nb_0, kb_0]$ the switching matrix can map each of the N TEM-encoded spatiotemporal field signals from a TEM-filter ([x,y], $\alpha$, $\theta$) to a reconstruction filter at ([x+$\alpha_0^m nb_0$, y+$\alpha_0^m kb_0$], $\alpha_0^m \alpha$, $\theta$).

According to some embodiments of the disclosed subject matter, methods of encoding a video signal include inputting the video signal into a first and second time encoding machine (TEM), the first TEM including a first TEM-input and a first TEM-output, the second TEM including a second TEM-input and a second TEM-output, wherein the first TEM-output is connected to the first TEM-input and the second TEM-input to provide negative feedback and the second TEM-output is connected to the first TEM-input and the second TEM-input to provide positive feedback.

Some embodiments further include outputting a first set of trigger values from the first TEM according to an equation $$u(t_k^1) = +\delta^1 + \sum_{l<k} h^{11}(t_k^1 - t_l^1) - \sum_{l} h^{21}(t_k^1 - t_l^2) 1_{\{t_l^2 < t_k^1\}} = q_k^1.$$

and outputting a second set of trigger values from the second TEM according to an equation $$u(t_k^2) = -\delta^2 + \sum_{l<k} h^{22}(t_k^2 - t_l^2) - \sum_{l} h^{12}(t_k^2 - t_l^1) 1_{\{t_l^1 < t_k^2\}} = q_k^2.$$

Yet other embodiments further include outputting a first set of trigger values from the first TEM according to an equation $$\int_{t_k^1}^{t_{k+1}^1} u(s) ds = \kappa^1 \delta^1 - b^1(t_{k+1}^1 - t_k^1) +$$

$$\sum_{l<k} \int_{t_k^1}^{t_{k+1}^1} h^{11}(s - t_l^1) \sum_{l} \int_{t_k^1}^{t_{k+1}^1} h^{21}(s - t_l^2) - ds 1_{\{t_l^1 < t_k^1\}} \text{ and}$$

outputting a second set of trigger values from the second TEM according to an equation $$\int_{t_k^2}^{t_{k+1}^2} u(s)\,ds = \kappa^2\delta^2 - b^2(t_{k+1}^1 - t_k^1) +$$

$$\sum_{l<k} \int_{t_k^2}^{t_{k+1}^2} h^{22}(s-t_l^2) \sum_l \int_{t_k^2}^{t_{k+1}^2} h^{12}(s-t_l^1) - ds \mathbb{1}_{\{t_l^1 < t_k^1\}}.$$

According to some embodiments of the disclosed subject matter, methods of decoding a video signal include receiving first and second TEM-encoded signals and applying an equation $$u(t) = \sum_{k\in\mathcal{J}} c_k^1 \psi_k^1(t) + \sum_{k\in\mathcal{J}} c_k^2 \psi_k^2(t),$$

where $\psi_k^j(t) = g(t-t_k^j)$, for $j=1, 2$, $g(t)=\sin(\Omega t)/\pi t$, $t\in\mathbb{R}$, $c=[c^1; c^2]$ and $[c^j]_k = c_k^j$, and a vector of coefficients c can be computed as $c = G^+ q$, where $q=[q^1; q^2]$ with $[q^j]_k = q_k^j$ and $$G = \begin{bmatrix} G^{11} & G^{12} \\ G^{21} & G^{22} \end{bmatrix}, \quad [G^{ij}]_{kl} = <x_k^i, \psi_l^j>, \text{ for all } j=1, 2, \text{ and } k, l \in \mathbb{Z}.$$

The accompanying drawings, which are incorporated and constitute part of this disclosure, illustrate preferred embodiments of the disclosed subject matter and serve to explain its principles.

Throughout the drawings, the same reference numerals and characters, unless otherwise stated, are used to denote like features, elements, components or portions of the illustrated embodiments. Moreover, while the present disclosed subject matter will now be described in detail with reference to the Figs., it is done so in connection with the illustrative embodiments.

DETAILED DESCRIPTION

Improved systems, methods, and applications of Time Encoding and Decoding machines are disclose herein.

Asynchronous Sigma/Delta modulators as well as FM modulators can encode information in the time domain as described in "Perfect Recovery and Sensitivity Analysis of Time Encoded Bandlimited Signals" by A. A. Lazar and L. T. Toth (*IEEE Transactions on Circuits and Systems—I: Regular Papers*, 51(10):2060-2073, October 2004), which is incorporated by reference. More general TEMs with multiplicative coupling, feedforward and feedback have also been characterized by A. A. Lazar in "Time Encoding Machines with Multiplicative Coupling, Feedback and Feedforward" (*IEEE Transactions on Circuits and Systems II: Express Briefs*, 53(8):672-676, August 2006), which is incorporated by reference. TEMs realized as single and as a population of integrate-and-fire neurons are described by A. A. Lazar in "Multichannel Time Encoding with Integrate-and-Fire Neurons" (*Neurocomputing*, 65-66:401-407, 2005) and "information Representation with an Ensemble of Hodgkin-Huxley Neurons" (*Neurocomputing*, 70:1764-1771, June 2007), both of which are incorporated by reference. Single-input single-output (SIMO) TEMs are described in "Faithful Representation of Stimuli with a Population of Integrate-and-Fire Neurons" by A. A. Lazar and E. A. Pnevmatikakis (*Neural Computation*), which is incorporated by reference.

Multi-input multi-output (MIMO) TEMs can encode M-dimensional bandlimited signals into N-dimensional time sequences. A representation of M-dimensional bandlimited signals can be generated using an N×M-dimensional filtering kernel and an ensemble of N integrate-and-fire neurons. Each component filter of the kernel can receive input from one of the M component inputs and its output can be additively coupled to a single neuron. (While the embodiments described refer to "neurons," it would be understood by one of ordinary skill that other kinds of TEMs can be used in place of neurons.)

Figure 1:
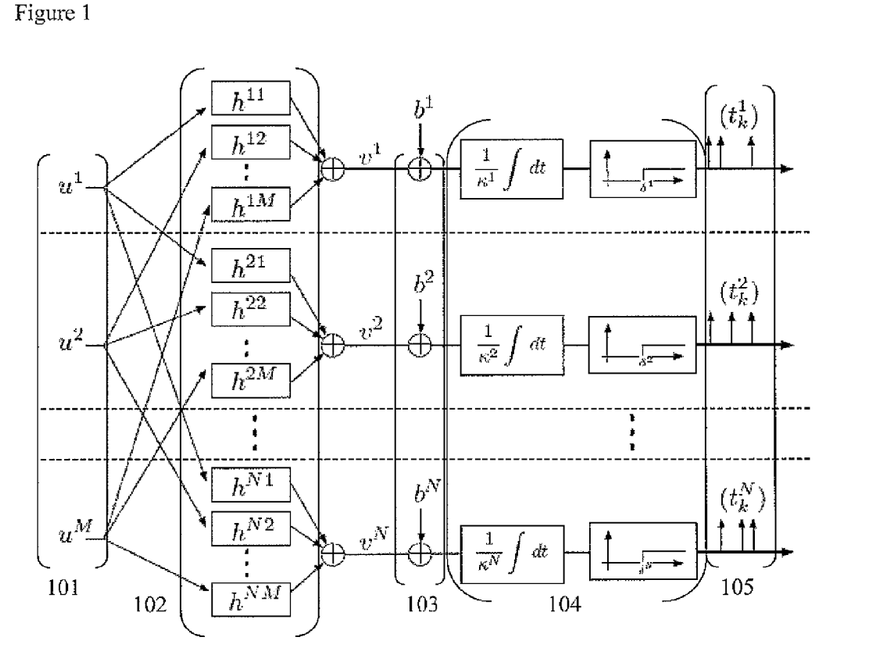
FIG. 1 depicts a multiple input multiple output Time Encoding Machine architecture in accordance with some embodiments of the disclosed subject matter.

As depicted in FIG. 1, in one embodiment, M components of a signal 101, can be filtered by a set of filters 102. The outputs of the filters can be additively coupled to a set of N TEMs 104 to generated a set of N spike-sequences or trigger times 105.

Let $\Xi$ be the set of bandlimited functions with spectral support in $[-\Omega, \Omega]$. The functions $u^i = u^i(t)$, $t\in\mathbb{R}$, in $\Xi$ can model the M components of the input signal. Without any loss of generality the signal components ($u^1, u^2, \ldots u^M$) can have a common bandwidth $\Omega$. Further, it can be assumed that the signals in $\Xi$ have finite energy, or are bounded with respect to the $L^2$ norm. Thus $\Xi$ can be a Hilbert space with a norm induced by the inner product in the usual fashion.

$\Xi^M$ can denote the space of vector valued bandlimited functions of the form u=$[u^1, u^2, \ldots, u^M]^T$, where T denotes the transpose. $\Xi^M$ can be a Hilbert space with inner product defined by $$<u, v>_{\Xi^M} = \sum_{i=1}^{M} <u^i, v^i>_\Xi \quad (1)$$

and with norm given by $$\|u\|_{\Xi^M}^2 = \sum_{i=1}^{M} \|u^i\|_\Xi^2, \quad (2)$$

where u=$[u^1, u^2, \ldots, u^M]^T \in \Xi^M$ and v=$[v^1, v^2, \ldots, v^M]^T \in \Xi^M$.

We can let H: $\mathbb{R} \mapsto \mathbb{R}^{N \times M}$ be a filtering kernel 102 defined as:

$$H(t) = \begin{bmatrix} h^{11}(t) & h^{12}(t) & \ldots & h^{1M}(t) \\ h^{21}(t) & h^{22}(t) & \ldots & h^{2M}(t) \\ \vdots & \vdots & \ddots & \vdots \\ h^{N1}(t) & h^{N2}(t) & \ldots & h^{NM}(t) \end{bmatrix} \quad (3)$$

where it can be assumed that supp($\hat{h}^{ij}$) $\supset [-\Omega, \Omega]$, for all i, i=1, 2, ..., M and all j, j=1, 2, ... N (supp denoting the spectral support and $\hat{}$ denotes the Fourier transform). Filtering the signal u with the kernel H can lead to an N-dimensional vector valued signal v defined by:

$$v \triangleq H * u = \begin{bmatrix} \sum_{i=1}^{M} h^{1i} * u^i \\ \sum_{i=1}^{M} h^{2i} * u^i \\ \vdots \\ \sum_{i=1}^{M} h^{Ni} * u^i \end{bmatrix}, \quad (4)$$

where * denotes the convolution. Equation (4) can be written as $$v^j = (h^j)^T * u, j=1, 2, \ldots N \quad (5)$$

where $h^j = [h^{j1}, h^{j2}, \ldots h^{jM}]^T$ is the filtering vector of the neuron, or TEM, j, j=1, 2, ... N. A bias $b^j$ 103 can be added to the component $v^j$ of the signal v and the sum can be passed through an integrate-and-fire neuron with integration constant $\kappa^j$ and threshold $\delta^j$ for all j, j=1, 2, ..., N. The value $(t_k^j)$, k∈$\mathbb{Z}$ can be the sequence of trigger (or spike) times 105 generated by neuron j, j=1, 2, ..., N. In sum, the TEM depicted in FIG. 1 can map the input bandlimited vector u into the vector time sequence $(t_k^j)$, k∈$\mathbb{Z}$ j=1, 2, ..., N.

In some embodiments the t-transform can describe the input/output relationship of the TEM, or the mapping of the stimulus u(t), t∈$\mathbb{R}$, into the output spike sequence $(t_k^j)$, k∈$\mathbb{Z}$ j=1, 2, ..., N. The t-transform for the j-th neuron can be written as $$\int_{t_k^j}^{t_{k+1}^j} (v^j(s) + b^j) ds = \kappa^j \delta^j, \text{ or} \quad (6)$$

$$\sum_{i=1}^{M} \int_{t_k^j}^{t_{k+1}^j} (h^{ji} * u^i)(s) ds = q_k^j, \quad (7)$$

where $q_k^j = \kappa^j \delta^j - b^j(t_{k+1}^j - t_k^j)$, for all k∈$\mathbb{Z}$ and j=1, 2, ... N.

Figure 2:
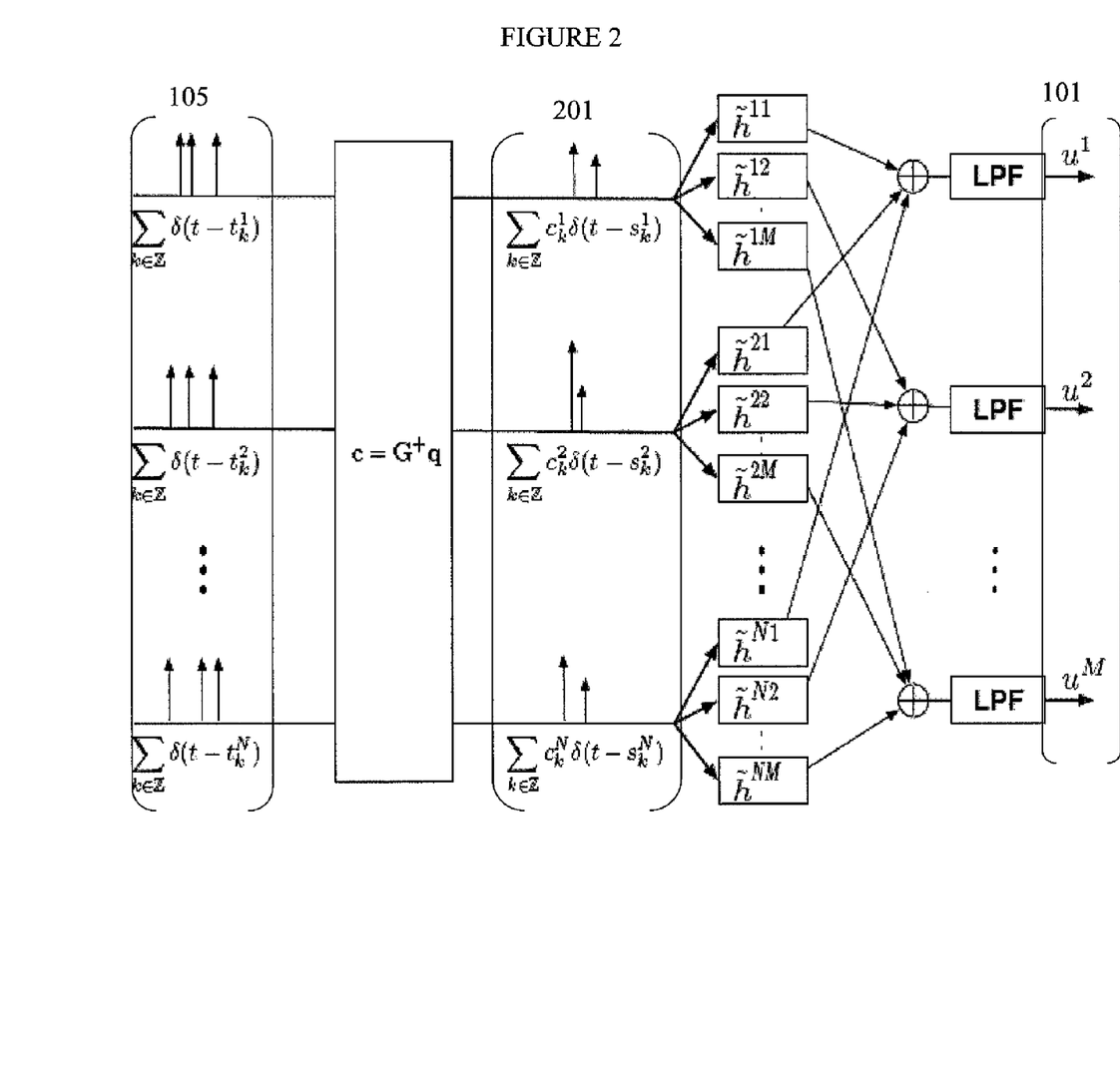
FIG. 2 depicts a multiple input multiple output Time Decoding Machine Architecture in accordance with some embodiments of the disclosed subject matter.

In some embodiments, as depicted in FIG. 2, recovering the stimuli or signal that was encoded 105 can be achieved by seeking the inverse of the t-transform 201. We can let g(t)=sin($\Omega t$)/$\pi t$, t∈$\mathbb{R}$, be the impulse response of a low pass filter (LPF) with cutoff frequency at $\Omega$. From Equation (5) $v^j \in \Xi$ and therefore the t-transform defined by Equation (7) can be written in an inner-product form as:

$$\sum_{i=1}^{M} <h^{ji} * u^i, g * 1_{[t_k^j, t_{k+1}^j]}> = q_k^j \Leftrightarrow \text{ or} \quad (8)$$

$$\sum_{i=1}^{M} <u^i, \tilde{h}^{ji} * g * 1_{[t_k^j, t_{k+1}^j]}> = q_k^j$$

where $\tilde{h}^{ji}$ is the involution of $h^{ji}$. From Equality (8) we can say that stimulus u=$(u^1, u^2, \ldots, u^M)^T$ can be measured by projecting it onto the sequence of functions $(\tilde{h}^j * g * 1_{[t_k^j, t_{k+1}^j]})$, k∈$\mathbb{Z}$ and j=1, 2, ... N. The values of the measurements, $q_k^j$, k∈$\mathbb{Z}$ and j=1, 2, ... N, are available for recovery. Thus the TEM can act as a sampler of the stimulus u, and because the spike times can depend on the stimulus, the TEM can act as a stimulus dependent sampler.

With $(t_k^j)$, k∈$\mathbb{Z}$ the spike times of neuron j, the t-transform, as shown in Equation (8), can be written in an inner product form as $$q_k^j = <u, \phi_k^j> \quad (9)$$

where $$\phi_k^j = \tilde{h}^j * g * 1_{[t_k^j, t_{k+1}^j]} = \begin{bmatrix} \tilde{h}^{j1} \\ \tilde{h}^{j2} \\ \vdots \\ \tilde{h}^{jM} \end{bmatrix} g * 1_{[t_k^j, t_{k+1}^j]} \quad (10)$$

for all k∈$\mathbb{Z}$ j=1, 2, ... N, t∈$\mathbb{R}$,

The stimulus u 101 can be recovered from Equation (9) if $\phi = \phi_k^j$, where k∈$\mathbb{Z}$ j=1, 2, ... N, is a frame for $\Xi^M$. Signal recover algorithms can be obtained using the frame $\psi = (\psi_k^j)$, k∈$\mathbb{Z}$ j=1, 2, ... N, where $$\psi_k^j(t) = (\tilde{h}^j * g)(t - s_k^j), \quad (11)$$

and $s_k^j = (t_{k+1}^j + t_k^j)/2$.

A filtering kernel H can be said to be BIBO stable if each of the filters $h^{ji} = h^{ji}(t)$, t∈$\mathbb{R}$, j=1, 2, ..., N, and i=1, 2, ..., M, is bounded-input bounded-output stable, i.e., $\|h^{ji}\|_1$ $\int_\mathbb{R} |h^{ji}(s)| ds < \infty$. Filtering vectors $h^j = [h^{j1}, h^{j2}, \ldots, h^{jM}]^T$, j=1, 2, ..., N, can be said to be BIBO stable if each of the components $h^{ji}$, i=1, 2, ... M, is BIBO stable. Further, if $\hat{H}$: $\mathbb{R} \to \mathbb{C}^{N \times M}$ is the Fourier transform of the filtering kernel H, then $$[\hat{H}(w)]^{nm} = \int_{\mathfrak{R}} h^{nm}(s)\exp(-iws)\,ds,$$ (5)

for all n=1, 2, ..., N, and m=1, 2, ..., M, where i=√−1. The filtering vectors $h^j$ can be said to have full spectral support if supp($\hat{h}^{ij}$) ⊃ [−Ω, Ω], for all i, i=1, 2, ... M. A BIBO filtering kernel $\overline{H}$ can be said to be invertible if $\hat{H}$ has rank M for all w∈[−Ω, Ω]. Filtering vectors ($h^j$), j=1, 2, ..., N, can be called linearly independent if there do not exist real numbers $\alpha_j$, j=1, 2, ... N, not all equal to zero, and real numbers $\alpha^j$, j=1, 2, ... N, such that $$\sum_{j=1}^{N} a_j (h^j * g)(t - \alpha^j) = 0$$

for all t, t∈ℝ, (except on a set of Lebesgue-measure zero).

Assuming that the filters $h^j=h^j(t)$, t∈ℝ, are BIBO stable, linearly independent and have full spectral support for all j, j=1, 2, ... N, and that matrix H is invertible, then the M-dimensional signal u=[$u^1, u^2, ..., u^M$]$^T$ can be recovered as $$u(t) = \sum_{j=1}^{N} \sum_{k \in \mathcal{J}} c_k^j \psi_k^j(t),$$ (12)

where $c_k^j$, k∈ℤ, j=1, 2, ... N are suitable coefficients provided that:

$$\sum_{j=1}^{N} \frac{b^j}{\kappa^j \delta^j} \geq M \frac{\Omega}{\pi}$$ (13)

and |$u^i(t)$|<$c^i$, i=1, 2, ... M.

Letting [$c^j$]$_k$=$c_k^j$ and c=[$c^1, c^2, ..., c^J$]$^T$, the coefficients c can be computed as $$c = G^+ q$$ (14)

202 where T denotes the transpose, q=[$q^1, q^2, ..., q^N$]$^T$, [$q^j$]$_k$=$q_k^j$ and $G^+$ denotes the pseudoinverse. The entries of the matrix G can be given by $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$ (15)

$$[G^{ij}]_{kl} = <\psi_l^j, \phi_k^i>$$
$$= \sum_{m=1}^{M} \int_{t_k^i}^{t_{k+1}^i} h^{im} * \tilde{h}^{jm} * g(t - s_l^j) ds$$

for all i=1, 2, ..., N, j=1, 2, ..., N, k∈ℤ l∈ℤ.

Assume that the filtering vectors $h^j=h^j(t)$, are BIBO stable, linearly independent and have full spectral support for all j, j=1, 2, ... N, and that matrix H is invertible. If $$\sum_{j=1}^{N} b^j / \kappa^j \delta^j$$

diverges in N, then there can exist a number $\mathcal{N}$ such that for all N≥$\mathcal{N}$ the vector valued signal u can be recovered as $$u(t) = \sum_{j=1}^{N} \sum_{k \in \mathcal{J}} c_k^j \psi_k^j(t)$$ (16)

and the $c_k^j$, k∈ℤ, j=1, 2, ... N, are given in the matrix form by c=$G^+$q.

Figure 3:
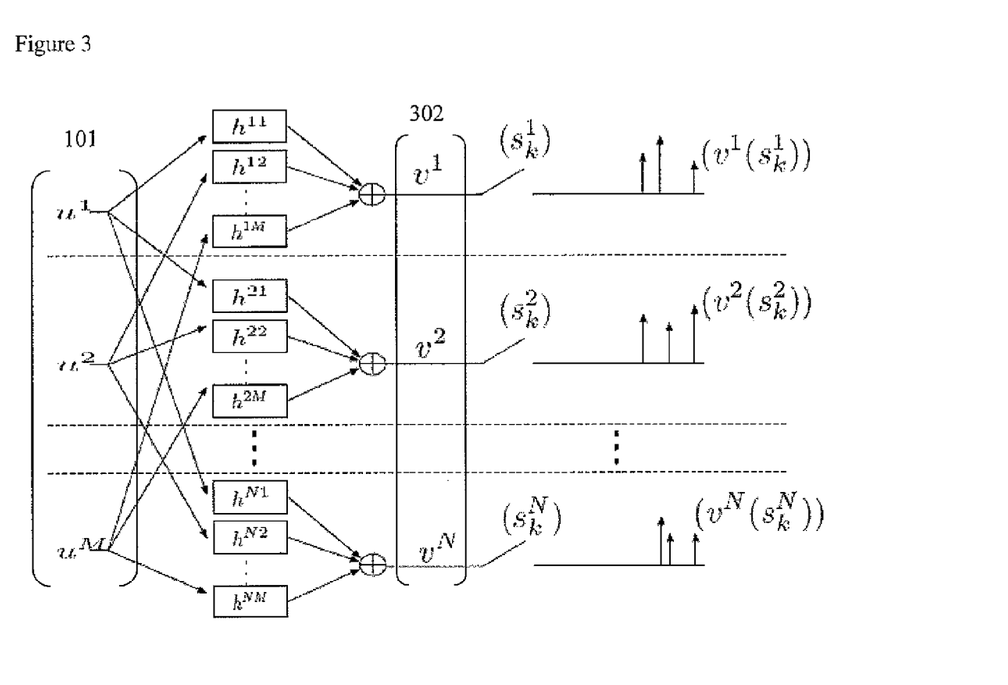
FIG. 3 depicts a multiple input multiple output irregular sampling architecture in accordance with some embodiments of the disclosed subject matter.

In some embodiments, the previously disclosed Multiple-Input-Multiple-Output scheme can be applied to an Irregular Sampling problem, as depicted in FIG. 3. While similar to the previously disclosed MIMO-TEM, integrate-and-fire neurons can be replaced by irregular (amplitude) samplers.

The samples for each signal 302 $v^j = h^{j1}*u^1 + h^{j2}*u^2 + ... + h^{jM}*u^M$ at times ($s_k^j$), k∈ℤ, j=1, 2, ... N, respectively can be recovered and $s_k^j = (t_{k+1} + t_k)/2$, k∈ℤ.

As with previous embodiments, assuming that the filtering vectors $h^j$ are BIBO stable for all j=1, 2, ..., N, and that H is invertible, the vector valued signal u, sampled with the circuit of FIG. 3, can be recovered as:

$$u(t) = \sum_{j=1}^{N} \sum_{k \in \mathcal{J}} c_k^j \phi_k^j(t)$$ (17)

provided that $$D > M \frac{\Omega}{\pi}$$

holds, where D is the total lower density. Further for [$c^j$]$_k$=$c_k^j$ and c=[$c^1, c^2, ... c^N$]$^T$, the vector of coefficients c can be computed as c=$G^+$q, where q=[$q^1, q^2, ... q^N$]$^T$ and [$q^j$]$_k$=$q_k^j$. The entries of the G matrix can be given by:

$$[G^{ij}]_{kl} = <\phi_l^j, \psi_k^i>$$ (18)
$$= \sum_{m=1}^{M} \left( h^{im} * \tilde{h}^{jm} * g * 1_{[t_l^j, t_{l+1}^j]} \right)(S_k^i).$$

In other embodiments, assuming that the filtering vectors $h^j$ are BIBO stable and have full spectral support for all j=1, 2, ... N and that H is invertible, the vector valued signal u, sampled with the circuit of FIG. 3, can be recovered as $$u = \sum_{j=1}^{N} \sum_{k \in \mathcal{J}} c_k^j \psi_k^j(t).$$ (19)

provided that $$D > M\frac{\Omega}{\pi}$$

holds where D is the total lower density. Further for $[c^j]_k = c_k^j$ and $c = [c^1, c^2, \ldots, c^N]^T$, the vector of coefficients c can be computed as $c = G^+q$, where $q = [q^1, q^2, \ldots, q^N]^T$ and $[q^j]_k = q_k^j$. The entries of the G matrix can be given by:

$$[G^{ij}]_{kl} = <\psi_l^j, \psi_k^i> \qquad (20)$$
$$= \sum_{m=1}^{M}(h^{im} * \tilde{h}^{jm} * g)(S_k^i - S_l^j).$$

In some embodiments, TEMs and TDMs can be used to encode and decode visual stimuli such as natural and synthetic video streams, for example movies or animations. Encoding and decoding visual stimuli is critical for, among other reasons, the storage, manipulation, and transmission of visual stimuli, such as multimedia in the form of video. Specifically, the neuron representation model and its spike data can be used to encode video from its original analog format into a "spike domain" or time-based representation; store, transmit, or alter such visual stimuli by acting on the spike domain representation; and decode the spike domain representation into an alternate representation of the visual stimuli, e.g., analog or digital. Moreover, in "acting" on the visual stimuli through use of the spike domain, one can dilate (or zoom) the visual stimuli, translate or move the visual stimuli, rotate the visual stimuli, and perform any other linear operation or transformation by acting or manipulating the spike domain representation of the visual stimuli.

Widely used modulation circuits such as Asynchronous Sigma/Delta Modulators and FM modulators have been shown to be instances of TEMs by A. A. Lazar and E. A. Pnevmatikakis in "A Video Time Encoding Machine" (*IEEE International Conference on Image Processing*, San Diego, Calif., Oct. 12-15, 2008), which is incorporated by reference. TEMs based on single neuron models such as integrate-and-fire (IAF) neurons, as described by A. A. Lazar in "Time Encoding with an Integrate-and-Fire Neuron with a Refractory Period" (*Neurocomputing*, 58-60:53-58, June 2004), which is incorporated by reference, and more general Hodgkin-Huxley neurons with multiplicative coupling, feedforward and feedback have been described by A. A. Lazar in "Time Encoding Machines with Multiplicative Coupling, Feedback and Feedforward," which was incorporated by reference above. Multichannel TEMs realized with invertible filterbanks and invertible IAF neurons have been studied by A. A. Lazar in "Multichannel Time Encoding with Integrate-and-Fire Neurons," which is incorporated by reference above, and TEMs realized with a population of integrate-and-fire neurons have been investigated by A. A. Lazar in "Information Representation with an Ensemble of Hodgkin-Huxley Neurons," which was incorporated by reference above. An extensive characterization of single-input single-output (SIMO) TEMs can be found in A. A. Lazar and E. A. Pnevmatikakis' "Faithful Representation of Stimuli with a Population of Integrate-and-Fire Neurons," which is incorporated by reference above.

Figure 8:
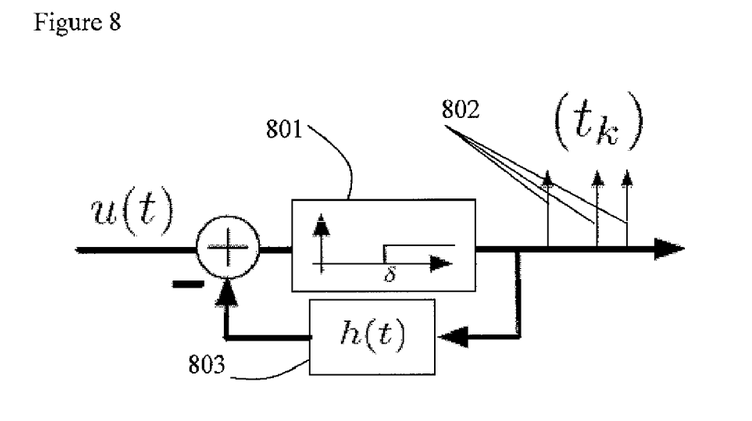
FIG. 8 depicts a time encoding circuit in accordance with some embodiments of the disclosed subject matter.

FIG. 8 depicts an embodiment of a time encoding circuit. The circuit can model the responses of a wide variety of retinal ganglion cells (RGCs) and lateral geniculate nucleus (LGN) neurons across many different organisms. The neuron can fire whenever its membrane potential reaches a fixed threshold δ 801. After a spike 802 is generated, the membrane potential can reset through a negative feedback mechanism 803 that gets triggered by the just emitted spike 802. The feedback mechanism 803 can be modeled by a filter with impulse response h(t).

As previously described, TEMs can act as signal dependent samplers and encode information about the input signal as a time sequence. As described in "Perfect Recovery and Sensitivity Analysis of Time Encoded Bandlimited Signals" by A. A. Lazar and László T. Tóth, which is incorporated by reference above, this encoding can be quantified with the t-transform which describes in mathematical language the generation of the spike sequences given the input stimulus. This time encoding mechanism can be referred to as a single neuron TEM. Where $(t_k)$, $k \in \mathbb{R}$, is the set of spike times of the output of the neuron, the t-transform of the TEM depicted in FIG. 1 can be written as $$u(t_k) = \delta + \sum_{l<k} h(t_k - t_l). \qquad (21)$$

Equation (21) can be written in inner product form as $$<u, \chi_k> = q_k, \qquad (22)$$

where $$q_k = u(t_k) = \delta + \sum_{l<k} h(t_k - t_l),$$

$\chi_k(t) = g(t-t_k)$, $k \in \mathbb{Z}$, and $g(t) = \sin(\Omega t)/\pi t$, $t \in \mathbb{R}$, is the impulse response of a low pass filter with cutoff frequency $\Omega$. The impulse response of the filter in the feedback loop can be causal, and can be decreasing with time.

Figure 9:
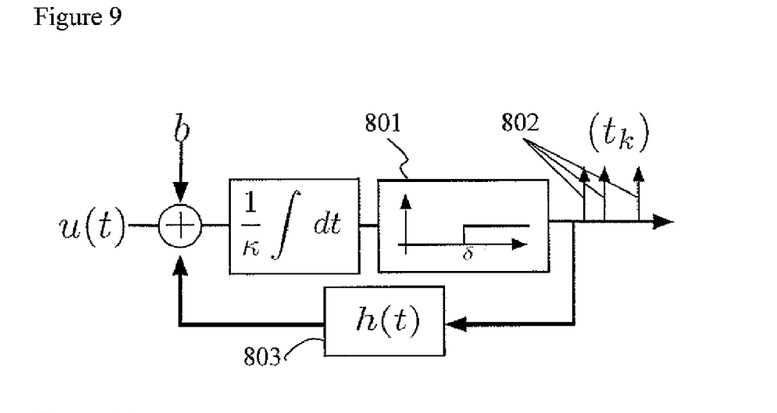
FIG. 9 depicts a single neuron encoding circuit that includes an integrate-and-fire neuron with feedback in accordance with some embodiments of the disclosed subject matter.

FIG. 9 depicts an embodiment of a single neuron encoding circuit that includes an integrate-and-fire neuron with feedback. The t-transform of the encoding circuit can be written as $$\int_{t_k}^{t_{k+1}} u(s)ds = \kappa\delta - b(t_{k+1} - t_k) - \sum_{l<k}\int_{t_k}^{t_{k+1}} h(s - t_l)ds, \qquad (23)$$

or in inner product form as $$<u, \chi_k> = q_k, \qquad (24)$$

with $$q_k = \kappa\delta - b(t_{k+1} - t_k) - \sum_{l<k}\int_{t_k}^{t_{k+1}} h(s - t_l)ds$$

and $$\chi_k(t) = g * 1_{[t_k, t_{k+1}]}, \text{ for all } k, k \in \mathbb{Z}.$$

In some embodiments, the bandlimited input stimulus u can be recovered as $$u(t) = \sum_{k \in \mathcal{J}} c_k \psi_k(t), \qquad (25)$$

where $\psi_k(t)=g(t-t_k)$, provided that the spike density of the neuron is above the Nyquist rate $\Omega/\pi$. For $[c]_k=c_k$, the vector of coefficients c can be computed as $c=G^+q$, where $G^+$ denotes the pseudoinverse of G, $[q]_k=q_k$ and $[G]_{kl}=<\chi_k, \psi_l>$.

Figure 10:
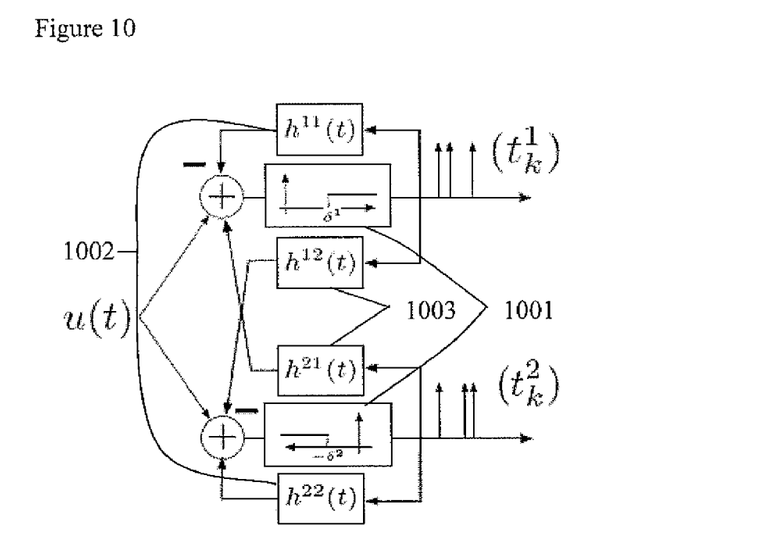
FIG. 10 depicts two interconnected ON-OFF neurons each with its own feedback in accordance with some embodiments of the disclosed subject matter.

FIG. 10 depicts an embodiment consisting of two interconnected ON-OFF neurons each with its own feedback. Each neuron can be endowed with a level crossing detection mechanism 1001 with a threshold δ that takes a positive value 1 and a negative value 2, respectively. Whenever a spike is emitted, the feedback mechanism 1002 can reset the corresponding membrane potential. In addition, each spike can be communicated to the other neuron through a cross-feedback mechanism 1003. In general, this cross-feedback mechanism can bring the second neuron closer to its firing threshold and thereby increases its spike density. The two neuron model in FIG. 10 can mimic the ON and OFF bipolar cells in the retina and their connections through the non-spiking horizontal cells. This time encoding mechanism can be described as an ON-OFF TEM.

For the TEM depicted in FIG. 10, with $(t_k^j)$, $k \in \mathbb{Z}$ representing the set of spike times of the neuron j, the t-transform of the ON-OFF TEM can be described by the equations $$u(t_k^1) = +\delta^1 + \sum_{l<k} h^{11}(t_k^1 - t_l^1) - \sum_{l} h^{21}(t_k^1 - t_l^2)1_{\{t_l^2 < t_k^1\}} = q_k^1 \qquad (26)$$

$$u(t_k^2) = -\delta^2 + \sum_{l<k} h^{22}(t_k^2 - t_l^2) - \sum_{l} h^{12}(t_k^2 - t_l^1)1_{\{t_l^1 < t_k^2\}} = q_k^2,$$

for all k, $k \in \mathbb{Z}$. The equations (31) can be written in inner product form as $$<u, x_k^j> = q_k^j \qquad (27)$$

for all k, $k \in \mathbb{Z}$ j, j=1, 2, where $x_k^j(t)=g(t-t_k^j)$, j=1, 2.

Figure 11:
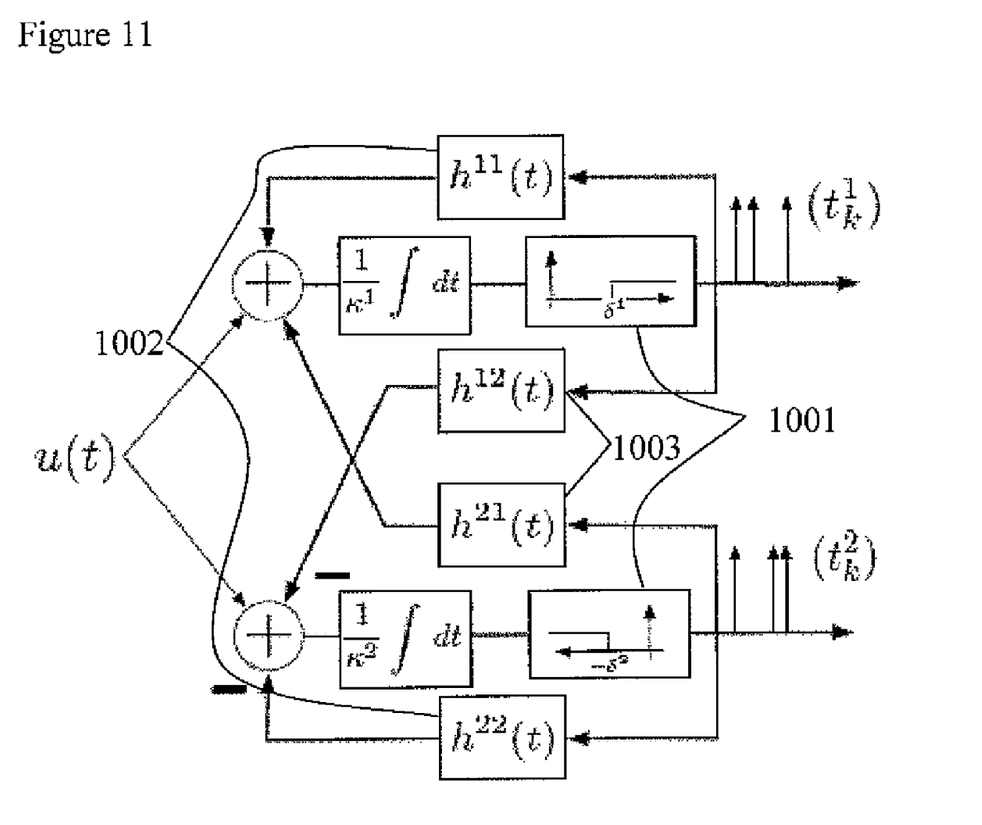
FIG. 11 depicts two interconnected ON-OFF neurons each with its own feedback in accordance with some embodiments of the disclosed subject matter.

FIG. 11 depicts an embodiment consisting of two interconnected ON-OFF neurons each with its own feedback. The t-transforms of the neurons depicted in FIG. 11 can be described by the equations $$\int_{t_k^1}^{t_{k+1}^1} u(s) ds = \kappa^1 \delta^1 - b^1(t_{k+1}^1 - t_k^1) + \qquad (28)$$

$$\sum_{l<k} \int_{t_k^1}^{t_{k+1}^1} h^{11}(s - t_l^1) - \sum_{l} \int_{t_k^1}^{t_{k+1}^1} h^{21}(s - t_l^2) ds 1_{\{t_l^2 < t_k^1\}}$$

$$\int_{t_k^2}^{t_{k+1}^2} u(s) ds = \kappa^2 \delta^2 - b^2(t_{k+1}^2 - t_k^2) + \sum_{l<k} \int_{t_k^2}^{t_{k+1}^2} h^{22}(s - t_l^2) -$$

$$\sum_{l} \int_{t_k^2}^{t_{k+1}^2} h^{12}(s - t_l^1) ds 1_{\{t_l^1 < t_k^2\}},$$

or in inner product form as $$<u, x_k^j> = q_k^j \qquad (29)$$

with $$q_k^j = \int_{t_k^j}^{t_{k+1}^j} u(s) ds, \text{ for all } k, k \in \mathbb{Z}, j, j = 1, 2.$$

In some embodiments, the input stimulus u can be recovered as $$u(t) = \sum_{k \in \mathcal{J}} c_k^1 \psi_k^1(t) + \sum_{k \in \mathcal{J}} c_k^2 \psi_k^2(t), \qquad (30)$$

where $\psi_k^j(t)=g(t-t_k^j)$, j=1, 2, provided that the spike density of the TEM is above the Nyquist rate $\Omega/\pi$. Moreover with $c=[c^1; c^2]$ and $[c^j]_k=c_k^j$, the vector of coefficients c can be computed as $c=G^+q$, where $q=[q^1; q^2]$ with $[q^j]_k=q_k^j$ and $$G = \begin{bmatrix} G^{11} & G^{12} \\ G^{21} & G^{22} \end{bmatrix}, [G^{ij}]_{kl} = <x_k^i, \psi_l^j>,$$

for all j=1, 2, and k,l∈$\mathbb{Z}$

Figure 4:
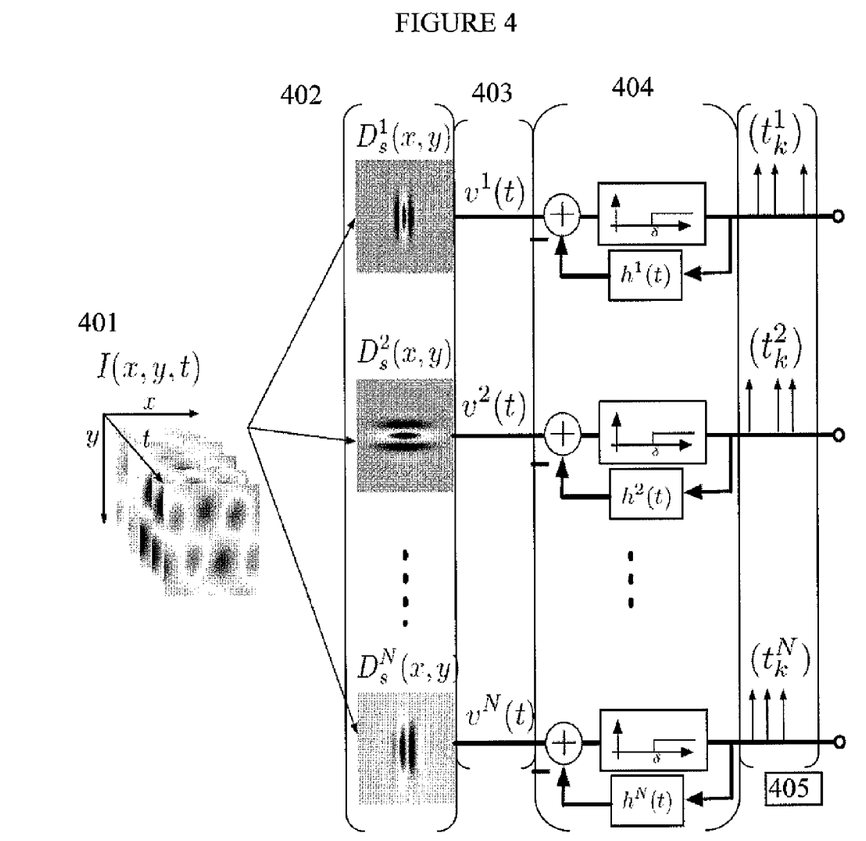
FIG. 4 depicts a video stream encoding device in accordance with some embodiments of the disclosed subject matter.

In one embodiment, as depicted in FIG. 4, let $\mathcal{H}$ denote the space of (real) analog video streams I(x,y,t) 401 which are bandlimited in time, continuous in space, and have finite energy. Assume that the video streams are defined on bounded spatial set X which is a compact subset of $\mathbb{R}^2$. Bandlimited in time can mean that for every $(x_0, y_0) \in X$ then $I(x_0, y_0, y) \in \Xi$, where $\Xi$ is the space of bandlimited functions of finite energy. In some embodiments, $\mathcal{H}=\{I=I(x,y,t)|I(x_0,y_0,t) \in \Xi, \forall (x_0,y_0) \in X \text{ and } I(x,y,t_0) \in L^2(X), \forall t_0 \in \mathbb{R},)\}$. The space $\mathcal{H}$, endowed with the inner product $<\bullet, \bullet>$: H$\mathbb{R}, \mapsto$ defined by:

$$<I_1, I_2> = \iint \int_{\mathbb{R} \otimes X} I_1(x,y,t) I_2(x,y,t) dx dy dt \qquad (31)$$

can be a Hilbert space.

Assuming that each neuron or TEM j, j=1, 2, ..., N has a spatiotemporal receptive field described by the function $D^j(x, y, t)$ 402, filtering a video stream with the receptive field of the neuron j gives the output $v^j(t)$ 403, which can serve as the input to the TEM 404:

$$v^j(t) = \int_{-\infty}^{+\infty} \left( \int \int_X D^j(x, y, s) I(x, y, t-s) dx dy \right) ds. \qquad (32)$$

In some embodiments, the receptive fields of the neurons can have only spatial components, i.e. $D^j(x,y,t)=D_s^j(x,y)\delta(t)$, where $\delta(t)$ is the Dirac function.

Where $t_k^j$, $k \in \mathbb{Z}$ represents the spike time of neuron j, j=1, 2, ... N, the t-transform can be written as $$v^j(t_k^j) = \delta^j + \sum_{l<k} h(t_k^j - t_l^j).$$

In inner product form, this can be written as $<I,\psi_k^j>=q_k^j$ with $$q_k^j = \delta^j + \sum_{l<k} h(t_k^j - t_l^j).$$ (5)

The sampling function can be given by $\psi_k^j(x,y,t)=\tilde{D}^j(x,y,t)*g(t-s_k^j)$ where $\tilde{D}^j(x,y,t)=D^j(x,y,-t)$. In embodiments with only spatial receptive fields, the sample functions can be written as $\phi_k^j(x,y,t)=D_s^j(x,y)*g(t-s_k^j)$.

Figure 5:
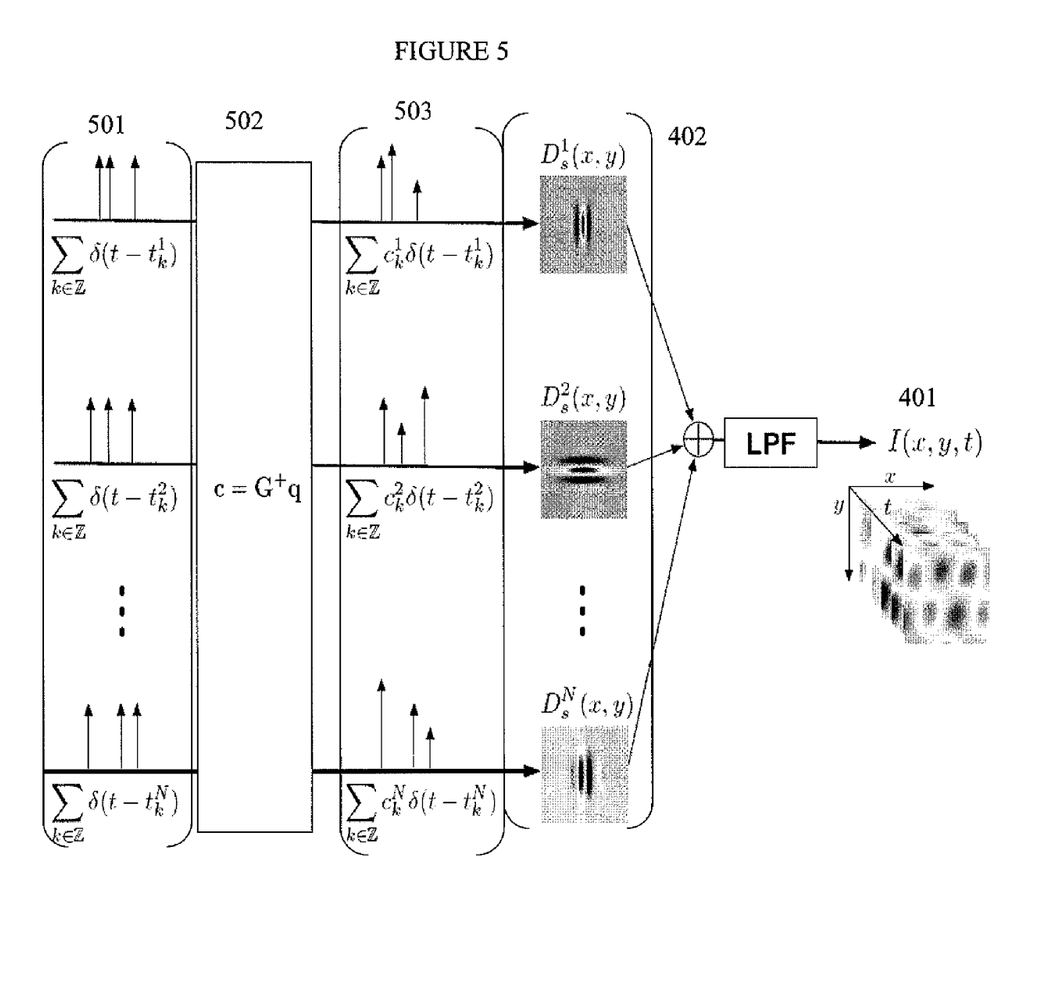
FIG. 5 depicts a video stream decoding device in accordance with some embodiments of the disclosed subject matter.

In some embodiments, as depicted in FIG. 5, decoding the TEM-encoded signal can be recovered using the same frame $\psi_k^j, j=1, 2, \ldots N, k\in\mathbb{Z}$, with $\psi_k^j(x,y,t)=D(x,y,t)*g(t-s_k^j)$ 503, 402. Where the filters modeling the receptive fields $D^j(x,y,t)$ are linearly independent and span the whole spatial domain of interest (i.e., for every $t_0\in\mathbb{R}$, $Dj(x,y,t_0))_j$ forms a frame for $L^2(X)$), if the total spike density diverges in N, then there can exist a number $\mathcal{N}$ such that if $N\geq\mathcal{N}$ then the video stream $I=I(x,y,t)$ can be recovered as $$I(x, y, t) = \sum_{j=1}^{N} \sum_{k\in\mathfrak{T}} c_k^j \psi_k^j(x, y, t)$$ (33)

503 and $c_k^j, k\in\mathbb{Z}, j=1, 2, \ldots, N$, are suitable coefficients.

Letting $[c^j]_k=c_k^j$ and $c=[c^1, c^2, \ldots c^1]^T$, the coefficients c can be computed as $$c=G^+q$$ (34)

502 where T denotes the transpose, $q=[q^1, q^2, \ldots q^N]^T$, $[q^j]_k=q_k^j$ and $G^+$ denotes the pseudoinverse. The entries of the matrix G can be given by $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix},$$

$[G^{ij}]_{kl}=<D^i(x,y,\bullet)*g(\bullet-t_k^i), D^j(x, y,\bullet)*g(\bullet-t_l^j)>$. Where the receptive field is only in the spatial domain, $$\psi_k^j(t) = D_s^j(x,y)g(t-s_k^j) \text{ and } [G^{ij}]_{kl} = \left(\int\int_X D^i(x,y)D^j(x,y)\,dxdy\right)g(t_k^i - t_l^j).$$

Figure 6:
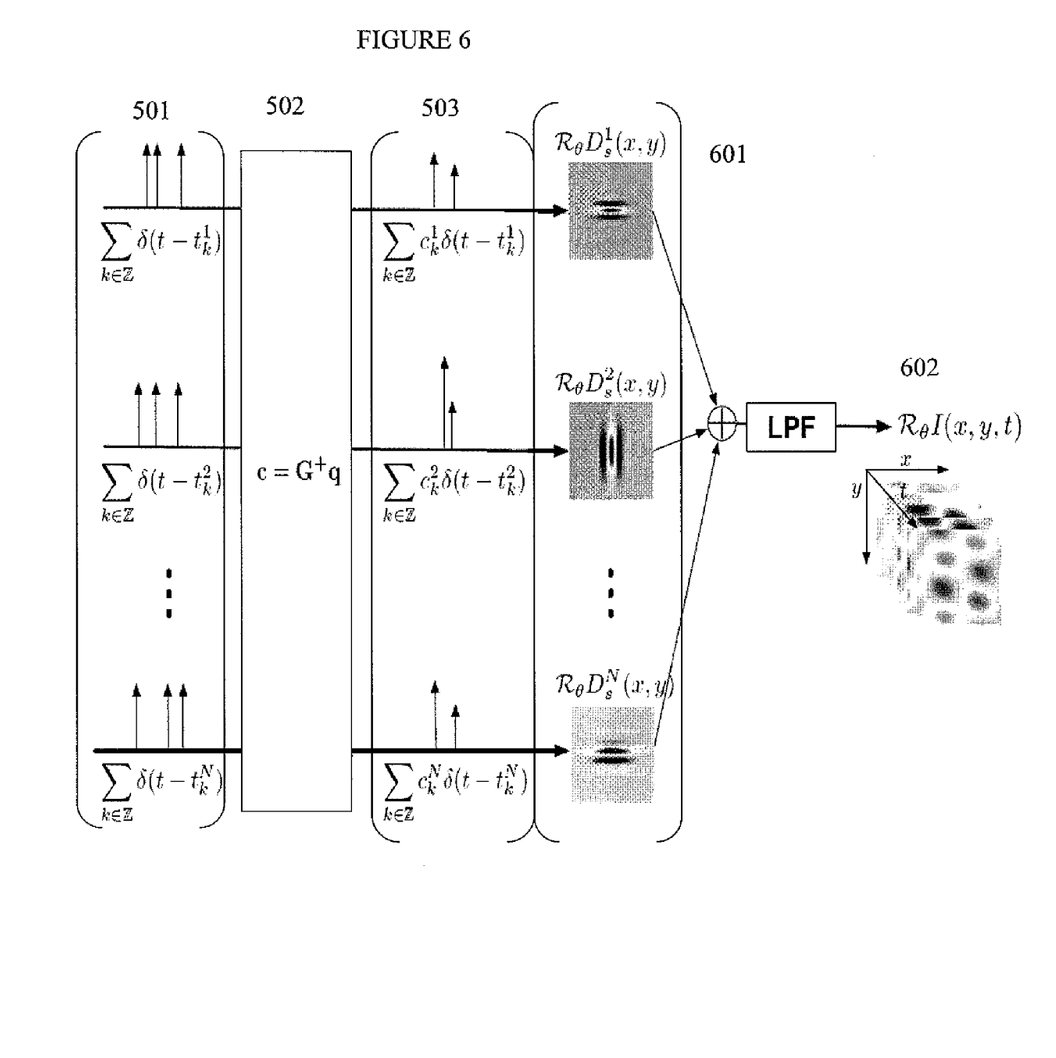
FIG. 6 depicts a second video stream decoding device in accordance with some embodiments of the disclosed subject matter.

In some embodiments, as depicted in FIG. 6, bounded and surjective operations on the elements of a frame can preserve the frame's characteristics. As such, bounded and surjective operations can be performed on the frames while in the spike domain (after being encoded by one or more TEMs and prior to being decoded by one or more TDMs) to alter the characteristics of the video. In accordance with the disclosed subject matter, a method of dilating, translating, and rotating a visual stimuli can be achieved by applying, for example, the following function to the encoded visual stimuli:

$$\psi_{\alpha,x_0,y_0,\theta}(x,y)=\alpha^{-1}R_\theta\psi(a^{-1}x-x_0,a^{-1}y-y_0),$$

601 where $\alpha$ represents the amount of dilation and is a real number not including zero; $x_0, y_0$ represents the amount of translation; $\theta$ represents the amount of rotation between 0 and $2\pi$; $R_\theta\psi(x,y)=\psi(x\cos(\theta)+y\sin(\theta),-x\sin(\theta)+y\cos(\theta))$; and $$\psi(x, y) = \frac{1}{\sqrt{2\pi}}\exp\left(-\frac{1}{8}(4x^2 + y^2)\right)(e^{ikx} - e^{k^2/2}).$$

Figure 7:
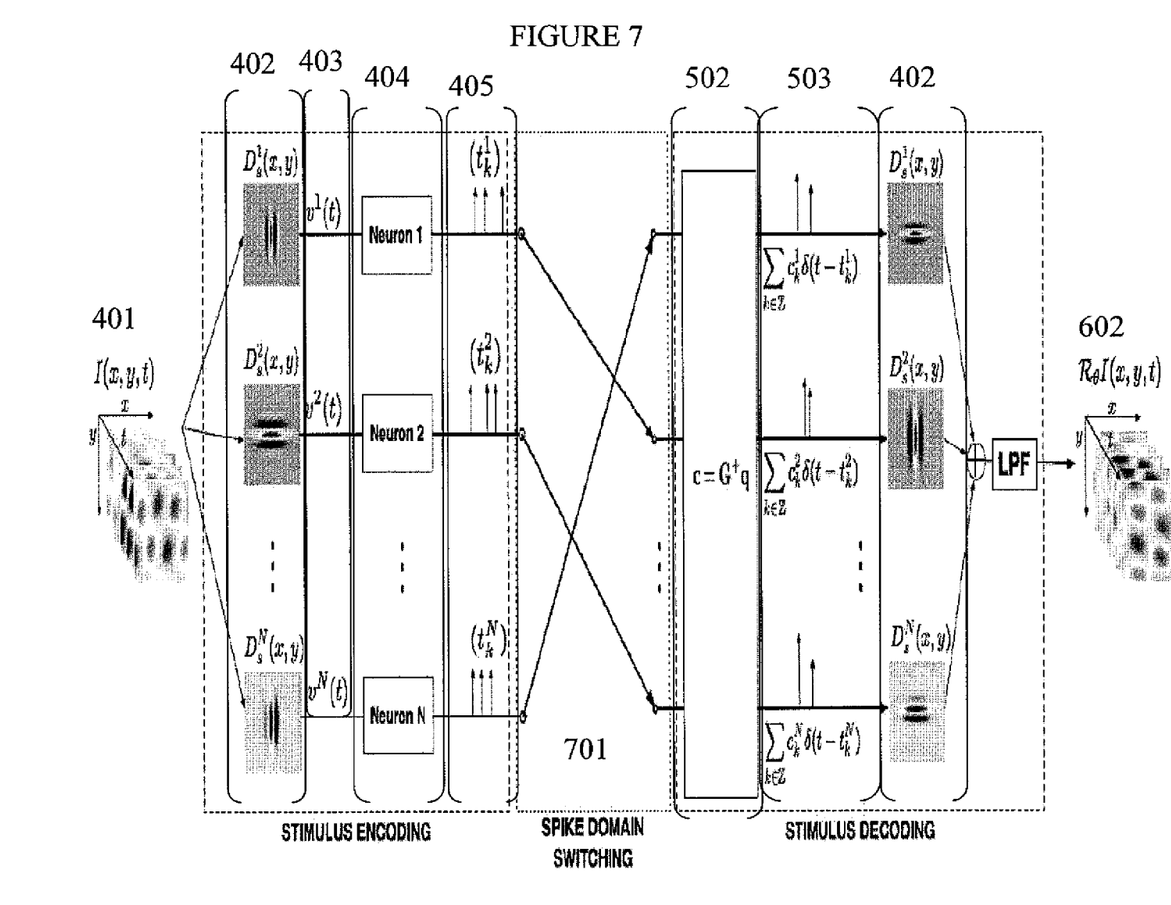
FIG. 7 depicts a video stream encoding and decoding device in accordance with some embodiments of the disclosed subject matter.

In further embodiments, the alterations to the video can be achieved by using a switching-matrix 701, as depicted in FIG. 7. To rotate the video by an angle $l\theta_0$, $l\in\mathbb{Z}$ the spike coming from filter element $([x,y], \alpha, \theta)$ can be mapped to the reconstruction filter at $([x,y], \alpha, \theta+l\theta_0)$. To dilate, or zoom the video by a value $\alpha_0^m$, $m\in\mathbb{Z}$ the spike coming from filter element $([x,y], \alpha, \theta)$ can be mapped to the reconstruction filter at $([x,y], \alpha_0^m \alpha, \theta)$. To translate a video by $[nb_0, kb_0]$, the spike coming from filter element $([x,y], \alpha, \theta)$ can be mapped to the reconstruction filter at $([x+nb_0, y+kb_0], \alpha, \theta)$. To simultaneous dilate by $\alpha_0^m$ and translate by $[nb_0, kb_0]$, then the spike coming from filter element $([x,y], \alpha, \theta)$ can be mapped to the reconstruction filter at $([x+\alpha_0^m nb_0, y+\alpha_0^m kb_0], \alpha_0^m \alpha, \theta)$.

The disclosed subject matter and methods can be implemented in software stored on computer readable storage media, such as a hard disk, flash disk, magnetic tape, optical disk, network drive, or other computer readable medium. The software can be performed by a processor capable of reading the stored software and carrying out the instructions therein.

The foregoing merely illustrates the principles of the disclosed subject matter. Various modifications and alterations to the described embodiments will be apparent to those skilled in the art in view of the teachings herein. It will thus be appreciated that those skilled in the art will be able to devise numerous techniques which, although not explicitly described herein, embody the principles of the disclosed subject matter and are thus within the spirit and scope of the disclosed subject matter.

The invention claimed is:

1. A method for encoding a plurality (M) of components of a signal comprising:
   filtering each of said M components into a plurality (N) of filtered signals; and
   encoding each of said N filtered-signals using at least one Time Encoding Machine (TEM) to generate a plurality (N) of TEM-encoded filtered signals.

2. The method of claim 1 wherein said at least one TEM is an integrate-and-fire neuron.

3. The method of claim 1 wherein said at least one TEM has multiplicative coupling.

4. The method of claim 1 wherein said at least one TEM is an asynchronous sigma/delta modulator.

5. The method of claim 1 further comprising adding to each of said N filtered-signals one of a plurality (N) of bias values.

6. The method of claim 1 wherein said M signals are irregularly sampled.

7. The method of claim 1 wherein each of said N filtered signals is represented by the equation $$v^j=(h^j)^T*u,j,$$

where $H^j=[h^{j1}, h^{j2}, \ldots h^{jM}]^T$ is a filtering vector corresponding to one of said N filtered signals represented by j.

8. The method of claim 1 wherein said N TEM-encoded filtered signals are represented by $q_k^j$ where $q_k^j=\kappa^j\delta^j-b^j(t_{k+1}^j-t_k^j)$, for all times represented by a value $k\in\mathbb{Z}$, and each of said N filtered signals represented by a value $j, j=1, 2, \ldots N$, where $\kappa^j$ is an integration constant, $\delta^j$ is a threshold value, and $b^j$ is a bias value for each of said N filtered signals.

9. A method for decoding a TEM-encoded signal comprising:
receiving a plurality (N) of TEM-encoded filtered signals;
decoding said N TEM-encoded filtered signals using at least one Time Decoding Machine (TDM) to generate a plurality (N) of TDM-decoded signal components; and
filtering each of said N TDM-decoded signal components into a plurality (M) of output signals components.

10. The method of claim 9, wherein one of said M output signal components, represented by the i-th component of the vector valued signal u, $|u^i(t)| \leq c^i$, can be recovered by solving for $$u^i(t) = \sum_{j=1}^{N} \sum_{k \in \mathcal{S}} c_k^j \psi_k^{ji}(t),$$

where
$\psi_k^{ji}(t) = (\tilde{h}^{ji} * g)(t - s_k^j)$, for all i, i=1, 2, ... M,
$s_k^j = (t_{k+1}^j + t_k^j)/2$,
$\tilde{h}^{ji}$ is the involution of $h^{ji}$,
$h^{ji}$ is represented in a TEM-filterbank $$h(t) = \begin{bmatrix} h^{11}(t) & h^{12}(t) & \cdots & h^{1M}(t) \\ h^{21}(t) & h^{22}(t) & \cdots & h^{2M}(t) \\ \vdots & \vdots & \ddots & \vdots \\ h^{N1}(t) & h^{N2}(t) & \cdots & h^{NM}(t) \end{bmatrix}, \text{ and}$$

$[c^j]_k = c_k^j$ j=1, 2, ... N, where $c = [c^1, c^2, \ldots, c^N]^T$, $c = G^+ q$, where $q = [q^1, q^2, \ldots, q^N]^T$ and $[q^j]_k = q_k^j$ and $$[G^{ij}]_{kl} = \sum_{m=1}^{M} \int_{t_k^j}^{t_{k+1}^j} h^{im} * \tilde{h}^{jm} * g(t - s_l^j) ds.$$

11. The method of claim 9, wherein said M TEM-encoded signals are irregularly sampled.

12. A method of encoding a video stream signal comprising:
filtering said video stream signal into a plurality (N) of spatiotemporal field signals; and
encoding each of said N spatiotemporal field signals with a Time Encoding Machine to generate a plurality (N) of TEM-encoded spatiotemporal field signals.

13. The method of claim 12 wherein said spatiotemporal field signals can be described by an equation:

$$v^j(t) = \int_{-\infty}^{+\infty} \left( \int \int_X D^j(x, y, s) I(x, y, t - s) dx dy \right) ds,$$

where $D^i(x,y,s)$ is a filter function, and $I(x, y, t)$ represents said input video stream.

14. The method of claim 12 wherein said N TEM-encoded spatiotemporal field signals are represented by a sampling function:
$\psi_k^j(x,y,t) = D(x,y,-t) * g(t - s_k^j)$, for k spike times, for each (x, y) in a bounded spatial set, where j corresponds to each of said N TEM-encoded spatiotemporal field signals, and where $g(t) = \sin(\Omega t)/\pi t$.

15. A method of decoding a TEM-encoded video stream signal comprising:
receiving a plurality (N) of TEM-encoded spatiotemporal field signals;
decoding each of said N TEM-encoded spatiotemporal field signals using a Time Decoding Machine (TDM) to generate a TDM-decoded spatiotemporal field signal; and
combining each of said TDM-decoded spatiotemporal field signals to recover said video stream signal.

16. The method of claim 15 wherein said decoding and said combining are achieved by applying an equation:

$$I(x, y, t) = \sum_{j=1}^{N} \sum_{k \in \mathcal{S}} c_k^j \psi_k^j(x, y, t)$$

where $\psi_k^j(x,y,t) = D(x,y,t) * g(t - s_k^j)$, for k spike times, for each (x, y) in a bounded spatial set, where j corresponds to each of said N TEM-encoded spatiotemporal field signals, and where $g(t) = \sin(\Omega t)/\pi t$, and
where $[c^j]_k = c_k^j$ and $c = [c^1, c^2, \ldots c^1]^T$, $c = G^+ q$, where T denotes a transpose, $q = [q^1, q^2, \ldots q^N]^T$, $[q^j]_k^j$ and $G^+$ denotes a pseudoinverse, a matrix G is represented by $$G = \begin{bmatrix} G^{11} & G^{12} & \cdots & G^{1N} \\ G^{21} & G^{22} & \cdots & G^{2N} \\ \vdots & \vdots & \ddots & \vdots \\ G^{N1} & G^{N2} & \cdots & G^{NN} \end{bmatrix}, \text{ and}$$

$[G^{ij}]_{kl} = \langle D^i(x, y, \cdot) * g(\cdot - t_k^i), D^j(x, y, \cdot) * g(\cdot - t_l^j) \rangle.$ 17. A method of altering a video stream signal comprising:
receiving a plurality (N) of TEM-encoded spatiotemporal field signals from a plurality (N) of TEM-filters; and
applying a switching matrix to map said N TEM-encoded spatiotemporal field signals to a plurality (N) of reconstruction filters in a video stream signal TDM.

18. The method of claim 17 for rotating said video stream signal wherein said switching matrix maps each of said N TEM-encoded spatiotemporal field signals from a TEM-filter ([x,y], α, θ) to a reconstruction filter ([x,y], α, θ+lθ$_0$), where lθ$_0$ represents a desired value of rotation.

19. The method of claim 17 for zooming said video stream signal wherein said switching matrix maps each of said N TEM-encoded spatiotemporal field signals from a TEM-filter ([x,y], α, θ) to a reconstruction filter ([x,y], α$_0^m$α, θ), where α$_0^m$ represents a desired value of zoom.

20. The method of claim 17 for translating said video stream signal by a value [nb$_0$, kb$_0$] wherein said switching matrix maps each of said N TEM-encoded spatiotemporal field signals from a TEM-filter ([x,y], α, θ) to a reconstruction filter at ([x+nb$_0$, y+kb$_0$], α, θ).

21. The method of claim 17 for zooming said video stream signal by a value α$_0^m$ and translating said video stream signal by a value [nb$_0$, kb$_0$] wherein said switching matrix maps each of said N TEM-encoded spatiotemporal field signals from a TEM-filter ([x,y], α, θ) to a reconstruction filter at ([x+α$_0^m$nb$_0$, y+α$_0^m$kb$_0$], α$_0^m$α, θ).

22. A method of encoding a video signal comprising:
inputting said video signal into a first and second time encoding machine (TEM), said first TEM comprising a first TEM-input and a first TEM-output, said second TEM comprising a second TEM-input and a second TEM-output;

wherein said first TEM-output is connected to said first TEM-input and said second TEM-input to provide negative feedback and said second TEM-output is connected to said first TEM-input and said second TEM-input to provide positive feedback.

23. The method of claim 22 further comprising:

outputting a first set of trigger values from said first TEM according to an equation $$u(t_k^1) = +\delta^1 + \sum_{l<k} h^{11}(t_k^1 - t_l^1) - \sum_l h^{21}(t_k^1 - t_l^2) 1_{\{t_l^2 < t_k^1\}} = q_k^1; \text{ and}$$

outputting a second set of trigger values from said second TEM according to an equation $$u(t_k^2) = -\delta^2 + \sum_{l<k} h^{22}(t_k^2 - t_l^2) - \sum_l h^{12}(t_k^2 - t_l^1) 1_{\{t_l^1 < t_k^2\}} = q_k^2.$$

24. The method of claim 22 further comprising:

outputting a first set of trigger values from said first TEM according to an equation $$\int_{t_k^1}^{t_{k+1}^1} u(s)\,ds = \kappa^1 \delta^1 - b^1(t_{k+1}^1 - t_k^1) +$$

$$\sum_{l<k} \int_{t_k^1}^{t_{k+1}^1} h^{11}(s - t_l^1) - \sum_l \int_{t_k^1}^{t_{k+1}^1} h^{21}(s - t_l^2)\,ds 1_{\{t_l^2 < t_k^1\}};$$

and outputting a second set of trigger values from said second TEM according to an equation $$\int_{t_k^2}^{t_{k+1}^2} u(s)\,ds = \kappa^2 \delta^2 - b^2(t_{k+1}^1 - t_k^1) +$$

$$\sum_{l<k} \int_{t_k^2}^{t_{k+1}^2} h^{22}(s - t_l^2) - \sum_l \int_{t_k^2}^{t_{k+1}^2} h^{12}(s - t_l^1)\,ds 1_{\{t_l^1 < t_k^2\}}.$$

25. A method of decoding a video signal comprising:

receiving first and second TEM-encoded signals; and applying an equation $$u(t) = \sum_{k \in \mathcal{Z}} c_k^1 \psi_k^1(t) + \sum_{k \in \mathcal{Z}} c_k^2 \psi_k^2(t),$$

where $\psi_k^j(t) = g(t - t_k^j)$, for $j = 1, 2$, $g(t) = \sin(\Omega t)/\pi t$, $t \in \mathbb{R}$,, $c = [c^1; c^2]$ and $[c^j]_k = c_k^j$, and a vector of coefficients c can be computed as $c = G^+ q$, where $q = [q^1; q^2]$ and $[q^j]_k = q_k^j$ and $$G = \begin{bmatrix} G^{11} & G^{12} \\ G^{21} & G^{22} \end{bmatrix}, [G^{ij}]_{kl} = <x_k^i, \psi_l^j>,$$

for all $j = 1, 2$, and $k, l \in \mathbb{Z}$.

* * * * *